United States Patent [19]
Sakamoto et al.

[11] Patent Number: 6,087,912
[45] Date of Patent: Jul. 11, 2000

[54] HIGH FREQUENCY MULTI-LAYER MODULE COMPRISING A DIELECTRIC RESONATOR

[75] Inventors: Koichi Sakamoto; Kenichi Iio, both of Nagaokakyo; Sadao Yamashita; Yohei Ishikawa, both of Kyoto, all of Japan

[73] Assignee: Murata Manufacturing Co., Ltd., Kyoto, Japan

[21] Appl. No.: 09/060,190

[22] Filed: Apr. 14, 1998

[30] Foreign Application Priority Data

Apr. 14, 1997 [JP] Japan ..................................... 9-095697
Mar. 23, 1998 [JP] Japan ..................................... 10-073871

[51] Int. Cl.$^7$ ....................................................... H01P 7/10
[52] U.S. Cl. ...................... 333/219.1; 333/247; 331/96; 331/107 DP; 331/117 D
[58] Field of Search ...................... 333/204, 205, 333/202, 219.1, 246, 247; 661/96, 108 D, 107 DP, 117 D

[56] References Cited

U.S. PATENT DOCUMENTS

| | | | |
|---|---|---|---|
| 5,138,436 | 8/1992 | Koepf | 333/247 X |
| 5,705,960 | 1/1998 | Izumiyama | 333/246 X |
| 5,786,740 | 7/1998 | Ishikawa et al. | 333/219.1 |
| 6,016,090 | 1/2000 | Iio et al. | 333/202 |

FOREIGN PATENT DOCUMENTS

| | | | |
|---|---|---|---|
| 2-135802 | 5/1990 | Japan | 333/247 |
| 5-259720 | 10/1993 | Japan | 333/247 |

OTHER PUBLICATIONS

Bierman H.: "Microwave Packages are Meeting GaAs Challenges" Microwave Journal, vol. 29, No. 11, Nov. 1986, pp. 26, 28, 31/32, 34, 36, 38/39 XP002042561, figure 1.

Iesekiel S. et al.: "Microwave Photonic Multichip Modules Packaged on A Glass–Silicon Substrate" IEEE Transactions on Microwave Theory and Techniques, vol. 43, No. 9, Part 02, Sep. 1995, pp. 2421–2426, XP000524239, figure 1.

Gheewala T. R.: "Packages For Ultra–High Speed GaAs ICS" Microelectronics Journal, vol. 16, No. 2, Mar. 1985, pp. 30–37, XP002046126, figure 1A.

European Search Report dated Jul. 24, 1998.

*Primary Examiner*—Benny Lee
*Assistant Examiner*—Barbara Summons
*Attorney, Agent, or Firm*—Ostrolenk, Faber, Gerb & Soffen, LLP

[57] ABSTRACT

An electronic module, comprising: a dielectric base plate having first and second opposing surfaces on which respective electrodes are disposed such that respective areas at the first and second surfaces are free of electrode material and aligned relative to one another to form a dielectric resonator; a first electronic component coupled to the base plate; and a first circuit sheet having first and second opposing surfaces, at least one aperture between the surfaces, and a conductor pattern disposed on the first surface, the first circuit sheet being disposed on the base plate such that: (i) the first electronic component is at least partially received within the aperture; and (ii) at least part of the conductor pattern is coupled to the dielectric resonator.

8 Claims, 7 Drawing Sheets

HIGH FREQUENCY MULTI-LAYER MODULE COMPRISING A DIELECTRIC RESONATOR

BACKGROUND OF THE INVENTION

1. Field of the Invention

The present invention relates to a high frequency electronic part and, in particular, to a high frequency module, such as a voltage control oscillator, a filter, an antenna duplexer, and an antenna module, which is used in the microwave band, the millimeter wave band, etc.

2. Description of the Related Art

As a result of the recent increase in the demand for mobile communications systems and the increase in the amount of information transmitted, the communication band for mobile communication is being expanded from the microwave band to the millimeter wave band. In constructing a dielectric filter, a voltage control oscillator (hereinafter referred to as "VCO") or the like is sometimes employed which includes a dielectric resonator (operating a $TE01\delta$ mode). The resonance frequency of an ordinary $TE01\ \delta$ mode dielectric resonator is determined by an outer diameter of a cylindrical dielectric member. The coupling of the resonator with a micro strip line or the like is determined by the distance therebetween. Accordingly, a high level of accuracy in size and positioning is required.

In view of this, the present applicant has proposed, in Japanese Patent Application No. JP-A-7-62625, a dielectric resonator and a dielectric filter in which the above problem has been eliminated and which excel in machining accuracy.

In the dielectric resonator and the dielectric filter of the above-mentioned patent application, electrodes are formed on both main surfaces of a dielectric plate, whereby part of the dielectric plate is used as a dielectric resonator. In such a dielectric resonator, the electrodes formed on the dielectric plate can be used as a high frequency ground plane, so that, by forming a micro strip line on another dielectric sheet or the like and stacking it together with the dielectric plate, m it is possible to form a high frequency module, such as a VCO, including a dielectric resonator and an electronic part.

FIG. 9 is a sectional view of an example of the construction of such a high frequency module. In the drawing, numeral 1 indicates a dielectric plate on both main surfaces of which electrodes are formed. Numeral 2 indicates a dielectric sheet, on the upper surface of which wiring patterns 4 and 5 are formed and which has a through-hole th having a land P at a predetermined position. An electronic part in the form of a chip 28, is mounted on the land P. Wiring patterns 23 and 24 are connected to each other by a bonding wire w.

As shown in FIG. 9, by adopting a two-layered structure, composed of the dielectric plate 1 and the dielectric sheet 2, it is possible to use the electrode 15 on the dielectric plate 1 as a high frequency ground plane, forming the wiring patterns 4 and 5 on the dielectric sheet 2 as a micro strip line.

However, when mounting an electronic part, such as an FET, the ground connection of the electronic part is effected through through-hole th shown in FIG. 9, so that the grounding path becomes rather long, which may have an adverse effect on the high frequency characteristics. Further, since an electronic part in the form of a chip is mounted on the land having a through-hole, the structure is rather poor in heat radiation property, so that it cannot be applied to an electronic part in which a great quantity of heat is generated.

The above problem exists not only in the case in which a dielectric resonator is formed in a part of the dielectric plate 1, but is common to cases in which a dielectric sheet or the like is stacked on a base material having a high frequency ground surface to form a high frequency module.

SUMMARY OF THE INVENTION

Accordingly, it is an object of the present invention to provide a high frequency module in which the above problems have been eliminated.

There is provided, in accordance with the present invention, a high frequency module of the type which is formed by stacking on a base material having a high frequency ground surface a sheet material or a plate material on the surface of which a high frequency circuit is formed and which consists of a dielectric or an insulating material, wherein an electronic part, constituting a part of the high frequency circuit, is mounted or formed on the base material, and wherein a hole through which the electronic part is exposed is provided in the sheet material or the plate material, an electrode of the electronic part being electrically connected to a conductor pattern on the sheet material or the plate material by means of a bonding wire through the hole.

FIG. 1 is a sectional view showing an example of the above construction. As shown in the drawing, an electronic part 28 is directly mounted on a high frequency ground surface 15 of a dielectric plate 1, and a dielectric sheet 2 having a hole 11 through which this electronic part 28 is exposed is stacked on the dielectric plate 1. The electrode of the electronic part 28 and conductor patterns 4 and 5 on the dielectric sheet 2 are connected to each other through bonding wires w.

Due to this construction, the electronic part is directly mounted or formed on the base material having a high frequency M ground surface, so that the ground connection of the electronic part is reliably effected, and there is no adverse influence on the high frequency characteristics due to the increase in the length of the grounding path. Further, since the heat generated by the electronic part is directly conducted to the base material, a high heat radiation property is obtained, so that it has no adverse influence on the electronic part and the peripheral members. Further, since the electronic part is provided on the base material, it is possible to reduce the height (thickness) of the whole, making it possible to reduce the height of the entire high frequency module. Further, since the electronic part does not protrude from the surface of the dielectric sheet or, if it does, it does so only to a small degree, the electronic part is mechanically protected.

Further, in this invention, an electronic part constituting a part of the high frequency circuit is mounted on the base material, and a conductor pattern for connecting the electrode of the electronic part is formed thereon. A conductor pattern electrically connected to the above-mentioned conductor pattern and a through-hole through which the electronic part is inserted is provided in the sheet material or the plate material.

Further, in this invention, an electronic part constituting a part of the high frequency circuit is formed on the base material, and a conductor pattern electrically connected to the electrode of the electronic part is provided on the sheet material or the plate material.

Further, in this invention, those portions of the base material opposite to each other with the dielectric plate placed therebetween are formed as non-electrode-formation sections, and electrodes are formed on both main surfaces of the dielectric plate to thereby form a dielectric resonator and a ground surface, the high frequency circuit including a conductor pattern connected to the dielectric resonator.

In the high frequency module, the electronic part can be directly formed on the base material, so that it is possible to use a sheet material or a plate material on which such an electronic part cannot be directly formed. Further, in the high frequency module, it is possible to easily form a high frequency module including a dielectric resonator.

DESCRIPTION OF THE PREFERRED EMBODIMENTS

The construction of a VCO according to a first embodiment of this invention will be described with reference to FIGS. 2 through 5B.

Figure 1:
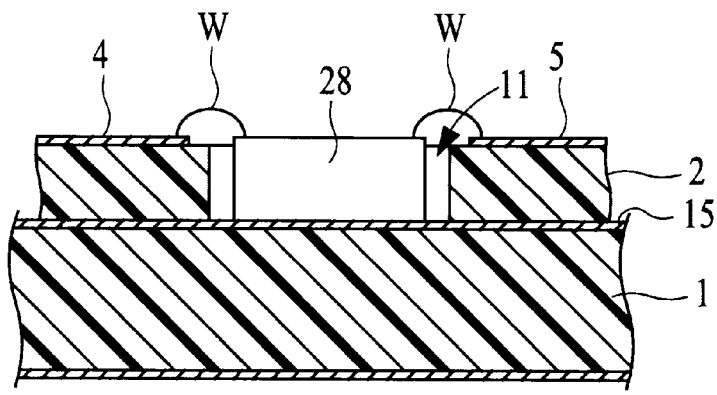
FIG. 1 is a sectional view showing an example of the construction of the high frequency module of this the present invention.
Figure 2:
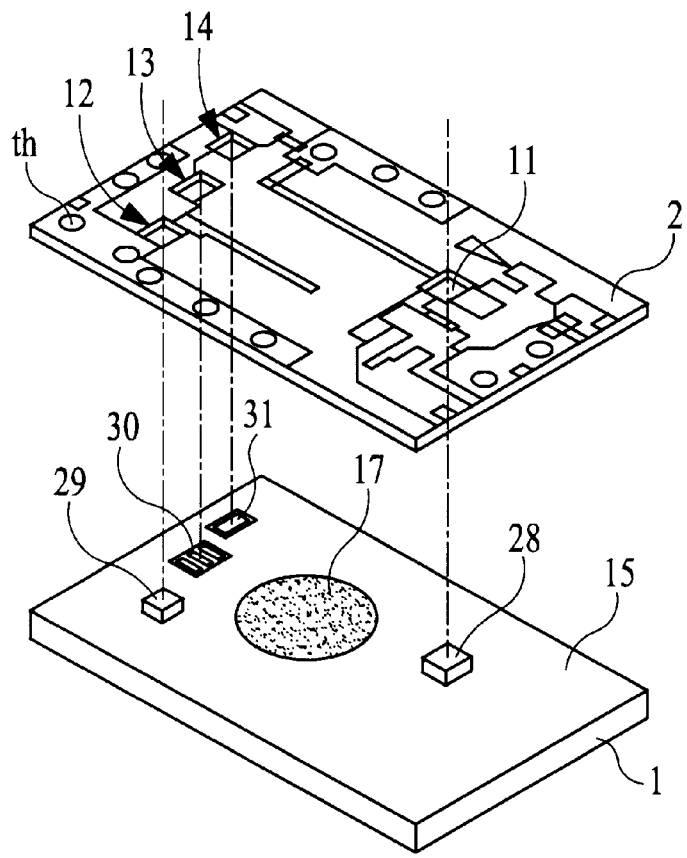
FIG. 2 is an exploded perspective view of a part of a VCO according to a first embodiment of this invention.

FIG. 2 is an exploded perspective view of a part of the VCO. In the drawing, numeral 1 indicates a dielectric plate. On the upper surface of the dielectric plate 1, there is formed an RF ground 15, a part of which is formed C-22, as a non-electrode-formation section 17. On the lower side of this dielectric plate 1, there is formed an RF ground. That portion of this RF ground which is opposite to the non-electrode-formation section 17 is formed as a non-electrode-formation section of the same configuration. An FET 28 and a varactor diode 29 are mounted at predetermined positions of the upper RF ground 15. Further, a thin-film inductor 30 and a thin-film resistor 31 are formed at predetermined positions of the RF ground 15. The RF ground 15 is not formed in the regions where the thin-film inductor 30 and the thin-film resistor 31 are formed.

In the drawing, numeral 2 indicates a dielectric sheet formed of polytetrafluoroethylene or the like and equipped with four holes 11, 12, 13 and 14. Further, there are formed a plurality of through-holes indicated by symbol th, and various conductor patterns are formed on the upper surface of the dielectric sheet 2.

Figure 3:
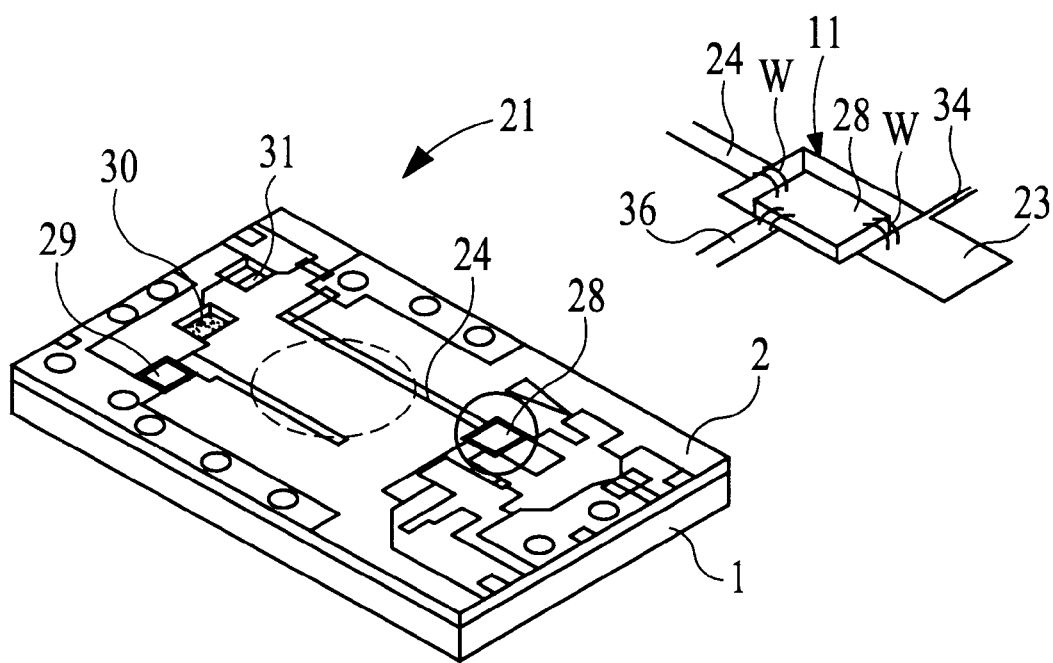
FIG. 3 is a perspective view showing a VCO module.

FIG. 3 is a perspective view showing the dielectric plate 1 and the dielectric sheet 2 of FIG. 2 stacked together. As shown in the drawing, the FET 28, the varactor diode 29, the thin-film inductor 30 and the thin-film resistor 31 are accommodated in the holes 11, 12, 13, and 14 provided in the dielectric sheet 2. As shown in the partial enlarged view of the drawing, the FET 28 is connected to micro strip lines 24 and 36 and a drain connection electrode 23 through bonding wires W. A similar connection through bonding wires 22 is effected on the varactor diode 29. The ends of the thin-film inductor 30 and the thin-film resistor 31 are connected to predetermined conductor patterns on the dielectric sheet 2 through electrodes formed in the inner surfaces of the holes 13 and 14 shown in FIG. 2.

The thermal conductivity of the dielectric plate, which is formed of $Ba(SnMgTa)O_3$, $Ba(MgTa)O_3$ or the like, is 2.0 to 5.0 W/(m.K), whereas the thermal conductivity of polytetrafluoroethylene is 0.1 to 0.3 W/(m.K), that is, the former is ten times or more higher than the latter, so that, as compared with the case in which the FET 28 is mounted on the dielectric sheet, the heat radiation property of the FET 28 is substantially improved.

Figure 4:
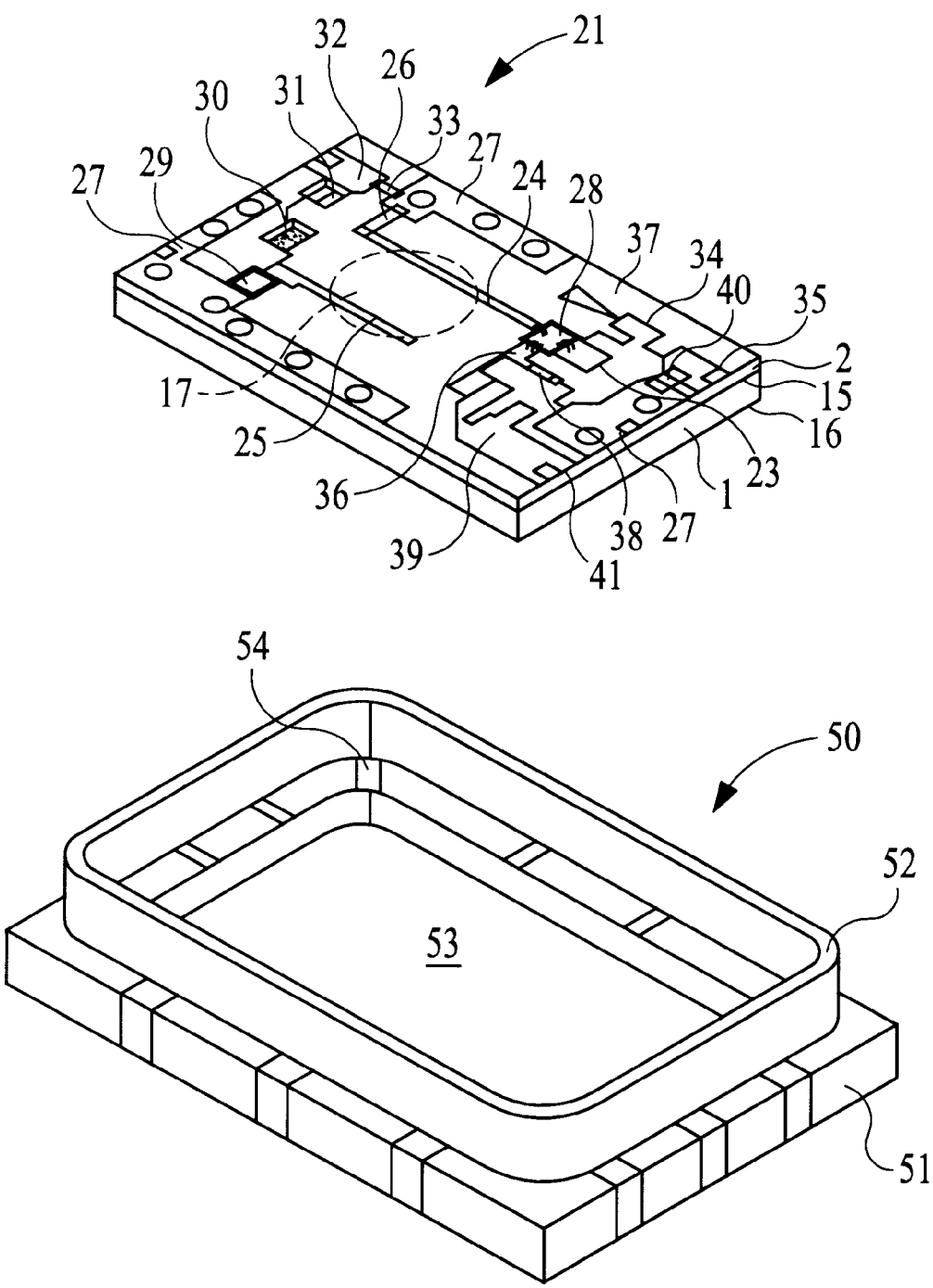
FIG. 4 is a perspective view showing the relationship between a ceramic package and a VCO module.

FIG. 4 is a perspective view of the VCO module 21 shown in FIG. 3 and a ceramic package 50 for accommodating it before they are assembled. As shown in the drawing, on the upper surface of the dielectric sheet 2, there are formed a micro strip line 24 constituting the main line and a micro strip line 25 constituting the sub-line such that they overlap the non-electrode-formation section 17 of the RF ground. One end of the micro strip line 24 is connected to a grounding electrode 27 through a resistor layer 26, and the other end thereof is connected to the gate of the FET through a bonding wire (See FIG. 3). One end of the micro strip line 25 is connected to the grounding electrode 27 through the varactor diode 29, and the other end thereof is a free end. Further, the thin-film inductor 30 is connected to the connection end of the micro strip line 25 corresponding to the varactor diode 29, and a bias electrode 32 for applying bias voltage is connected to-the thin-film inductor 30 through the thin-film resistor 31. Further, the resistor layer 33 is formed between the bias electrode 32 and the grounding electrode 27.

The drain of the FET 28 is connected to an input electrode 35 through a micro strip line 34, and the source thereof is connected to one end of a micro strip line 36. Further, a chip capacitor 40 is connected between the input electrode 35 and the grounding electrode 27. The micro strip line 34 is equipped with a matching stub 37 which is near the connection point at which it is connected to the drain of the FET 28. The drain connection electrode 23 is also used as a matching stub.

The other end of the micro strip line 36 is connected to the grounding electrode 27 through the resistor layer 38. Further, another micro strip line 39, which is at a fixed distance from the micro strip line 36, is provided, and the end portion thereof is formed as an output electrode 41.

The ceramic package 50 is composed of a first ceramic substrate 51 and a second ceramic substrate 52. The first ceramic substrate 51 is equipped with a recess 53, and an external terminal 54 is formed so as to surround the recess 53. At the bottom of the recess 53, there is formed a conductor. The VCO module 21 is accommodated in the ceramic package 50, with the dielectric sheet 2 side facing downward, and the input electrode 35, the output electrode 41, the bias electrode 32 and the other grounding electrodes 27 are connected to the external terminal 54. Then, the whole is sealed by a metal plate (not shown), whereby a surface mounting type VCO is completed.

Figure 5A:
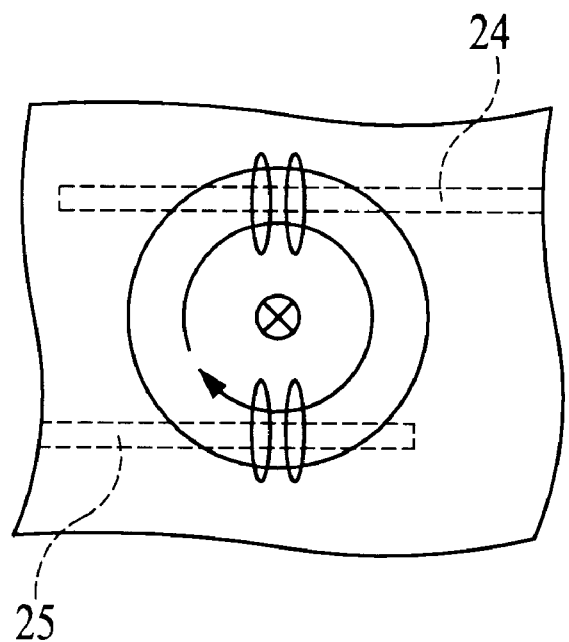
FIGS. 5A and 5B are diagrams showing the construction of a dielectric resonator formed on a dielectric plate.
Figure 5B:
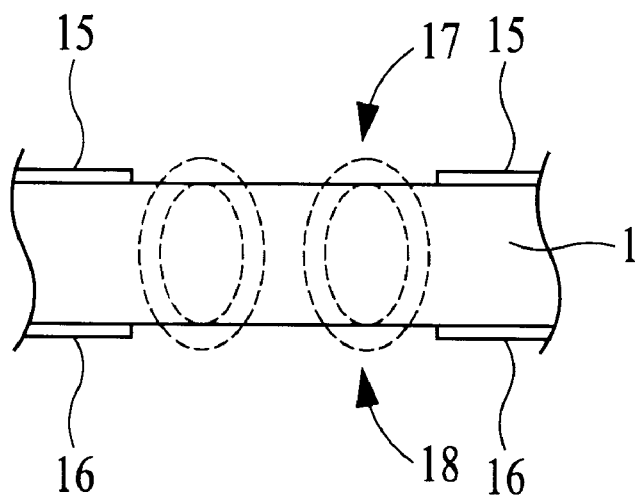

FIGS. 5A and 5B include a partial plan view and a partial sectional view showing the construction and resonance mode of a dielectric resonator formed on the dielectric plate. In the drawing, the solid line arrow indicates an electric field distribution, and the dashed lines indicate a magnetic field distribution. In this way, by arranging non-electrode-deformation sections 17 and 18 opposite to each other with the dielectric plate 1 being placed therebetween, a $TE_{010}$ mode dielectric resonator is formed in that section. The micro strip lines 24 and 25 are magnetic-field-connected to this dielectric resonator.

As described above, the main line and the sub-line are connected to the dielectric resonator, and the varactor diode is connected to the end portion of the sub-line, whereby a band reflection taupe resonator is formed in which one end of the main line constitutes a resistor end, the other end thereof being connected to the FET.

Next, the construction of a part of a high frequency module according to a second embodiment of the present invention will be described with reference to FIG. 6.

Figure 6:
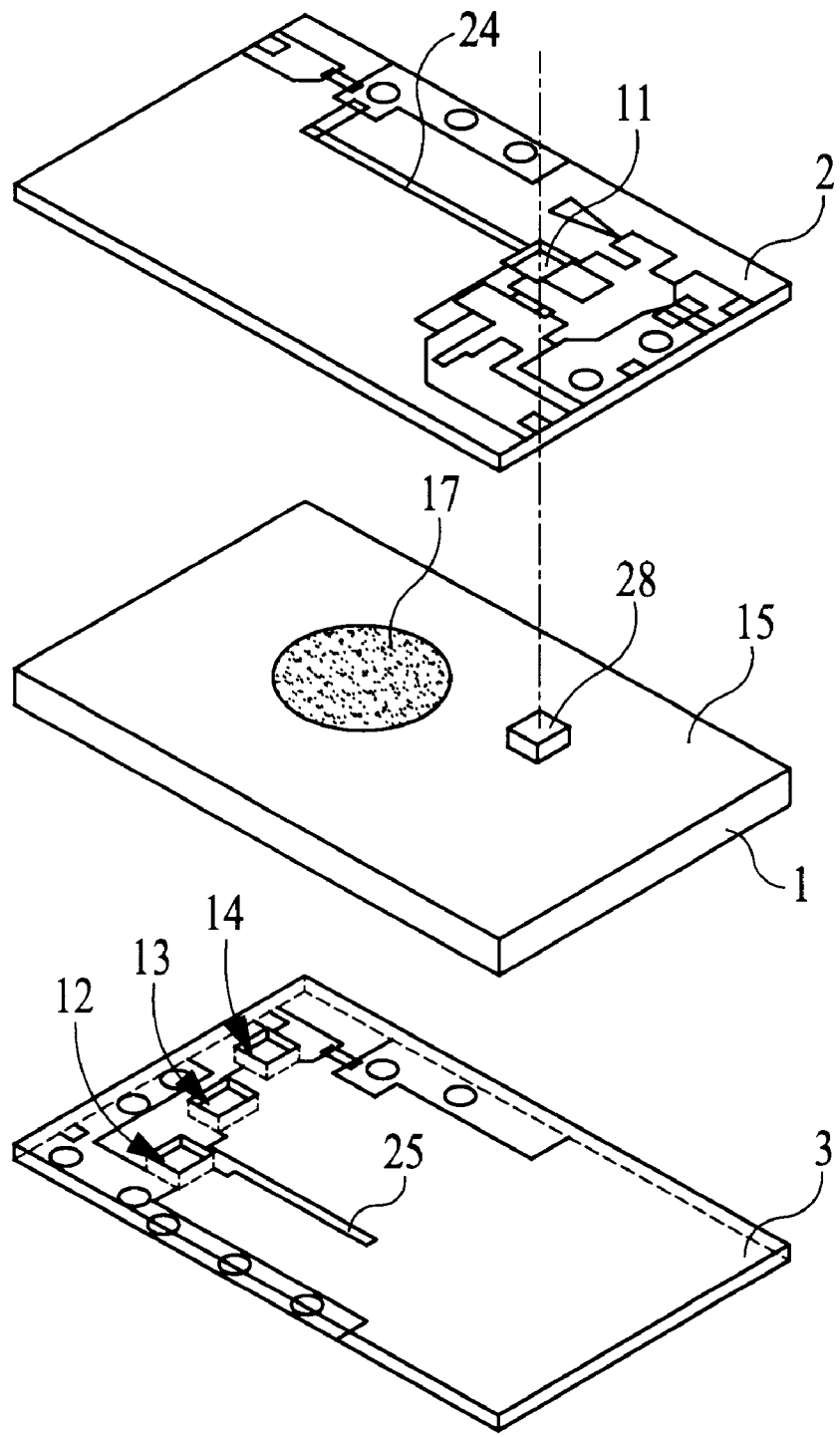
FIG. 6 is an exploded perspective view of a VCO module according to a second embodiment of the present invention.

FIG. 6 is an exploded perspective view of a part of the high frequency module. In the drawing, numeral 1 indicates a dielectric plate, on the upper surface of which there is formed an RF ground 15, a part of which is formed as a non-electrode-formation section 17. On the lower side of this dielectric plate 1, there is formed an RF ground having a non-electrode-formation section opposite to the non-electrode-formation section 17 and of the same configuration therewith. An FET 28 is mounted at a predetermined position of the upper. RF ground 15, and a varactor diode is mounted on the lower RF ground. Further, a thin-film inductor and a thin-film resistor are formed at predetermined positions of the lower RF ground.

In the drawing, numerals 2 and 3 indicate dielectric sheets formed of polytetrafluoroethylene or the like and equipped with holes 11, 12, 13 and 14. Further, a plurality of through-holes are formed, and various conductor patterns are formed on the upper side of the dielectric sheet 2 and the lower side of the dielectric sheet 3.

As is apparent from the comparison of FIG. 6 with FIG. 2, in this second embodiment, dielectric sheets are attached to the upper and lower sides of the dielectric plate to form circuits on the upper and lower sides of the dielectric plate. In this construction, both sides of the dielectric plate can be effectively utilized, and a reduction in the size of the entire structure can be achieved. Further, since the dielectric resonator and the micro strip lines placed on either side thereof are arranged symmetrically, it is possible to restrain the generation of an unnecessary mode in the dielectric plate.

Next, the construction of a part of a high frequency module in accordance with a third embodiment of the invention will be described with reference to FIG. 7.

Figure 7:
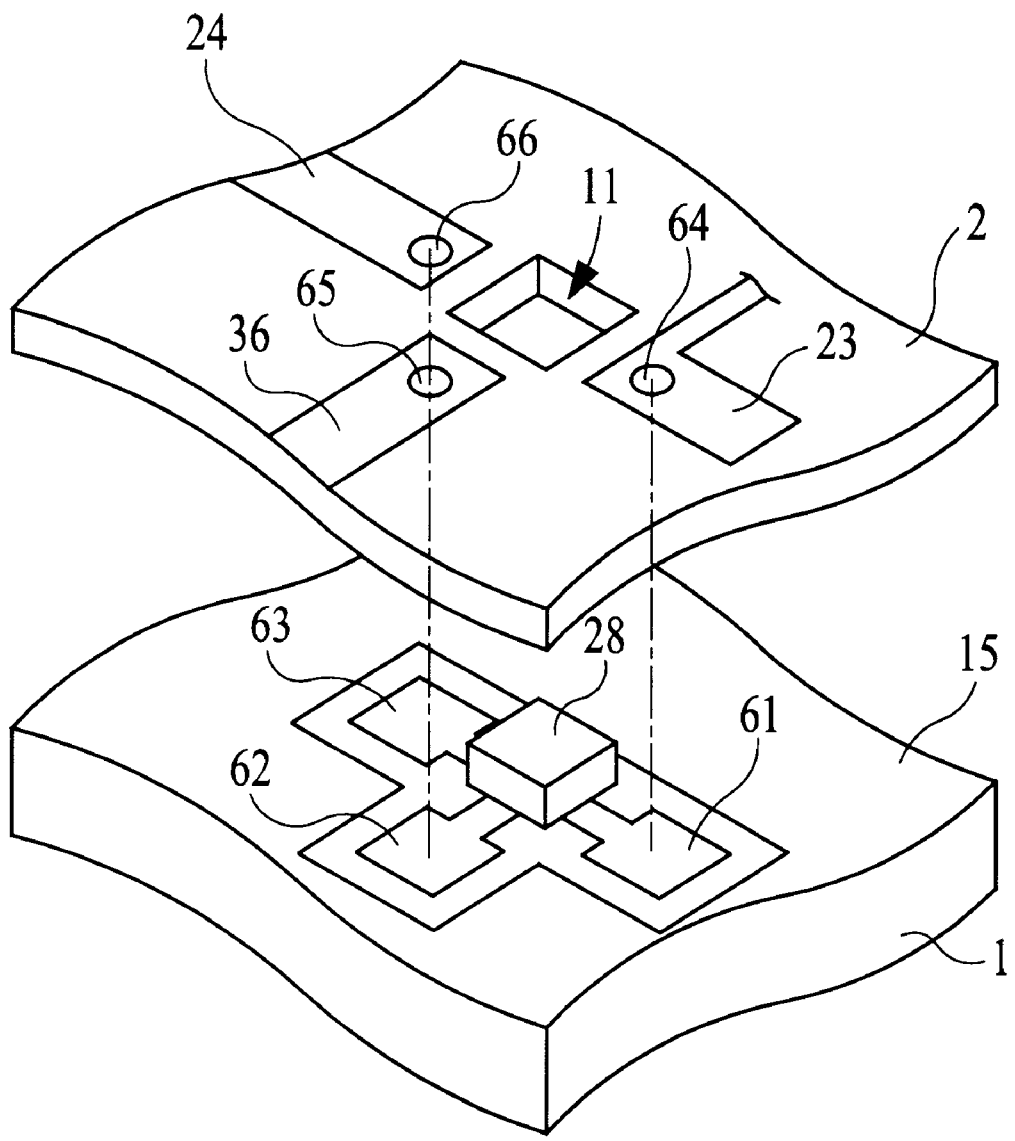
FIG. 7 is an exploded perspective view of a part of a high frequency module according to a third embodiment of the present invention.

FIG. 7 is an exploded perspective view showing the construction of the dielectric plate side and the dielectric sheet side in the electronic part mounting portion. In the first embodiment, shown in FIGS. 2 through 5, the electrode of the electronic part and the conductor pattern on the dielectric sheet are connected to each other through a bonding wire. In this third embodiment, in contrast, the connection is effected through through-holes provided in the dielectric sheet. In FIG. 7, conductor-patterns 61, 62 and 63 are formed on the upper side of the dielectric plate 1, and an RF ground 15 is formed so as to cover the upper side except for the region where the conductor patterns are formed. The FET 28 is placed with its pad surface facing downwards, and connected (bonded) to the end portions of the conductor patterns 61, 62 and 63. The dielectric sheet 2 is provided with a hole 11 corresponding to the FET 28, and through-holes 64, 65 and 66 connected to the conductor patterns 61, 62 and 63 are provided in the drain connection electrode 23 and the micro strip lines 36 and 24. By stacking the dielectric sheet 2 on the dielectric plate 1, the drain, source and gate of the FET 28 are connected to a predetermined conductor pattern on the dielectric sheet 2.

Figure 8:
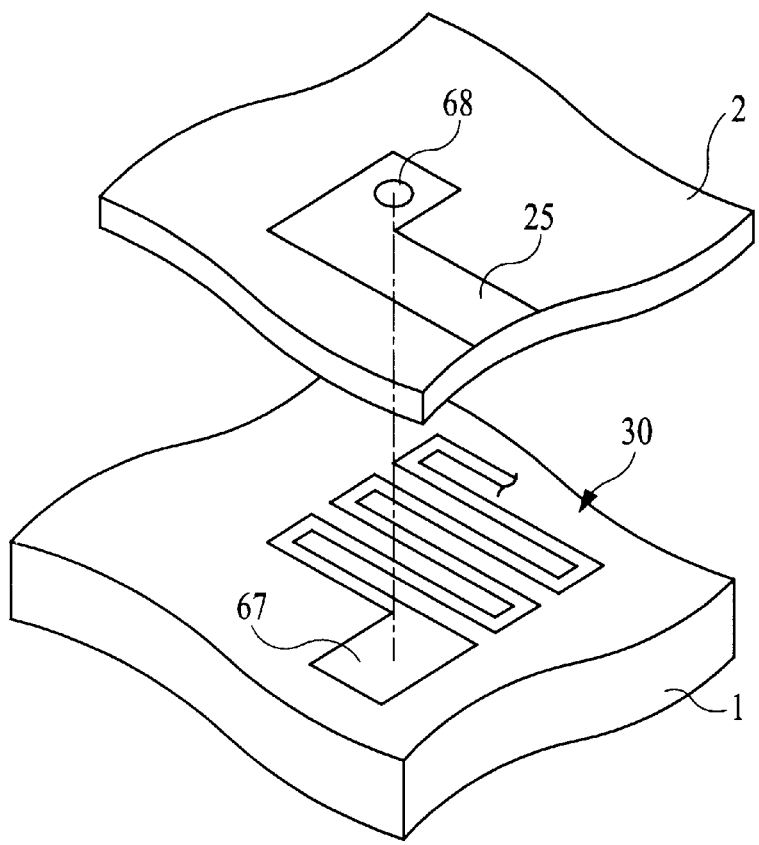
FIG. 8 is an exploded perspective view of a part of a high frequency module according to a fourth embodiment of the present invention.
Figure 9:
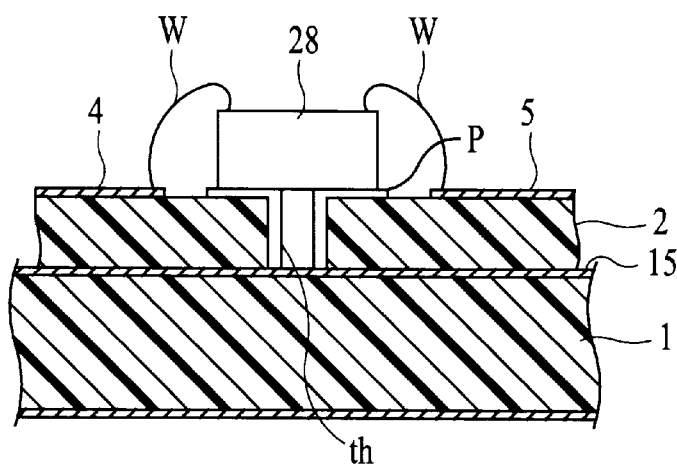
FIG. 9 is a sectional view showing the construction of a conventional high frequency module.

Next, FIG. 8 is a partial exploded perspective view showing the construction of a part of a high frequency module according to a fourth embodiment of the invention. While in the first and second embodiments holes are formed in the dielectric sheet, in this fourth embodiment, electronic parts, such as a thin-film inductor and a thin-film resistor, are directly formed on the dielectric plate 1, and the connection to the circuit on the dielectric sheet is effected through a through-hole provided in the dielectric sheet. With reference to FIG. 8, a thin-film inductor 30 has at one end a conductor pattern 67 provided on the upper side of the dielectric plate 1. A micro strip line 25 has at one end a through-hole 68 provided on -the dielectric sheet 2. By stacking them together, the thin-film inductor 30 is electrically connected to the end portion of the micro strip line 25. Due to this arrangement, there is no limitation due to the material of the dielectric sheet 2, whereby it is possible to easily form an arbitrary minute conductor pat-tern on the dielectric plate 1 side.

While in the above-described embodiments a dielectric sheet is used, it is also possible to use a dielectric plate thinner than the dielectric plate used as the base material. Further, while in the above-described embodiments a dielectric sheet is used, it is also possible to use an insulating sheet material or a plate material having a low dielectric constant.

Further, while the above embodiments have been described as applied to a voltage control oscillator, the present invention is naturally also applicable to other high frequency modules, such as a filter, an antenna combier, and an antenna module.

According to the present invention, an electronic part is directly mounted or formed on a base material having a high frequency ground surface, so that the ground connection of the electronic part is reliably effected, and there is no adverse influence on the high frequency characteristic due to the increase in the length of the grounding path. Further, since the heat generated by the electronic part is directly conducted to the base material, a high level of heat radiation property is obtained, and there is no adverse influence on the electronic part and the peripheral members. Further, since the electronic part is provided on the base material, the height (thickness) dimension of the entire structure is reduced, and the height of the entire high frequency module can be reduced. Further, the electronic part does not protrude from the surface of the dielectric sheet, or, if it does, it does so only to a small degree, whereby the electronic part is mechanically protected.

Further, in the aspect of the invention, an electronic part can be directly formed on the base material, so that it is possible to use a sheet material or a plate material on which such an electronic part cannot be directly formed.

Further, in the high frequency module, it is possible to easily obtain a high frequency module including a dielectric resonator.

Although the present invention has been described in relation to particular embodiments thereof, many other variations and modifications and other uses will become apparent to those skill(ed in the art. It is preferred, therefore, that the present invention be limited not by the specific disclosure herein, but only by the appended claims.

What is claimed is:

1. An electronic module, comprising:
   a dielectric base plate having first and second opposing surfaces on which respective electrodes are disposed such that respective areas at the first and second surfaces are free of electrode material and aligned relative to one another to form a dielectric resonator;

a first electronic component coupled to the base plate; and a first circuit sheet having first and second opposing surfaces, at least one aperture between the surfaces, and a conductor pattern disposed on the first surface, the first circuit sheet being disposed on the base plate such that: (i) the first electronic component is at least partially received within the aperture; and (ii) at least part of the conductor pattern is coupled to the dielectric resonator.

2. The electronic module of claim 1, further comprising at least one bonding wire extending through the aperture and electrically connecting the first electronic component to the conductor pattern on the first circuit sheet.

3. The electronic module of claim 1, further comprising at least one bonding wire electrically connecting the first electronic component to the conductor pattern on the first circuit sheet.

4. The electronic module of claim 1, wherein:

at least one area at the first surface of the base plate is free of electrode material;

at least one conductor pad is disposed on the first surface of the base plate within the at least one area such that the conductor pad is not electrically connected to the electrode;

the first electronic component is disposed at the at least one area of the base plate such that the conductor pad is electrically connected to the first electronic component; and the first circuit sheet includes a conductive via between the first and second surfaces thereof which is disposed proximate to the aperture, and the conductor pattern includes at least one connection pad coupled to the conductive via, the first circuit sheet being disposed on the base plate such that the conductive via connects the conductor pad of the base plate to the connector pad of the first circuit sheet.

5. The electronic module of claim 1, wherein a plurality of electronic components are coupled to the base plate, and the first circuit sheet includes a plurality of apertures between the first and second surfaces thereof, each of the apertures at least partially receiving a respective one of the electronic components.

6. The electronic module of claim 5, wherein at least one of the electronic components is disposed on the electrode of the first surface of the base plate.

7. The electronic module of claim 5, wherein at least one of the electronic component is disposed on the first surface of the base plate without being connected to the electrode thereof.

8. The electronic module of claim 1, wherein the first electronic component is coupled to the first surface of the base plate and a plurality of electronic components are coupled to the second surface of the base plate, the electronic module further comprising a second circuit sheet having first and second opposing surfaces, a plurality of apertures between the surfaces, and a conductor pattern disposed on the first surface, the second circuit sheet being disposed on the base plate opposite the first circuit sheet such that: (i) each aperture receives at least one of the plurality of electronic components; and (ii) at least part of the conductor pattern is coupled to the dielectric resonator.

\* \* \* \* \*